United States Patent
Hsieh et al.

(10) Patent No.: US 6,607,675 B1
(45) Date of Patent: Aug. 19, 2003

(54) METHOD OF ETCHING CARBON-CONTAINING SILICON OXIDE FILMS

(75) Inventors: Chang Lin Hsieh, San Jose, CA (US); Hui Chen, Santa Clara, CA (US); Jie Yuan, San Jose, CA (US); Yan Ye, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 19 days.

(21) Appl. No.: 09/650,975

(22) Filed: Aug. 29, 2000

(51) Int. Cl.[7] ............... H01L 21/027; H01L 21/3065
(52) U.S. Cl. ................ 216/67; 216/72; 216/79; 216/80; 438/714; 438/723; 438/738; 438/743
(58) Field of Search .............. 216/51, 67, 79, 216/80, 49, 72; 438/714, 723, 727, 730, 738, 743

(56) References Cited

U.S. PATENT DOCUMENTS

| | | | | |
|---|---|---|---|---|
| 4,427,516 A | * | 1/1984 | Levinstein et al. | 156/345.1 |
| 4,857,140 A | * | 8/1989 | Loewenstein | 156/643 |
| 5,242,538 A | * | 9/1993 | Hamrah et al. | 216/66 |
| 5,814,563 A | * | 9/1998 | Ding et al. | 438/714 |
| 6,114,259 A | | 9/2000 | Sukharev et al. | 438/789 |
| 6,165,891 A | * | 12/2000 | Chooi et al. | 257/758 |
| 6,251,770 B1 | * | 6/2001 | Uglow et al. | 438/624 |
| 6,340,435 B1 | * | 1/2002 | Bjorkman et al. | 216/13 |
| 6,346,490 B1 | * | 2/2002 | Catabay et al. | 438/788 |
| 6,350,670 B1 | * | 2/2002 | Andideh et al. | 438/618 |
| 6,368,979 B1 | * | 4/2002 | Wang et al. | 216/79 |
| 2002/0001952 A1 | * | 8/2001 | Chooi et al. | 438/687 |

FOREIGN PATENT DOCUMENTS

| | | | |
|---|---|---|---|
| DE | 19654737 A1 | 7/1997 | |
| EP | 0553961 | 8/1993 | H01L/21/311 |
| JP | 02280355 | 11/1990 | H01L/21/90 |
| JP | 09260350 A | * 10/1997 | C23F/4/00 |
| JP | 09260350 | 10/1997 | H01L/21/3065 |
| JP | 2001210627 | 8/2001 | H01L/21/3065 |
| WO | WO 00/39846 | 7/2000 | H01L/21/311 |

OTHER PUBLICATIONS

Copy of Search Report in corresponding PCT Application No. PCT/US01/26314, mailed Apr. 16, 2002.

Min Park et al., "High Quality Conformal Silicon Oxide Films Prepared by Multi–Step Sputtering PECVD and Chemical Mechanical Polishing," Journal of Electronic Materials, Nov. 1998, 1262–1267, vol. 27(11), TMS & IEEE.

Wai Fan Yau et al., "Method of Depositing a Low K Dielectric with Organo Silane," Patent Application with U.S. Patent & Trademark Office filed Feb. 11, 1998, Ser. No. 09/021,786. (Attorney Docket: AM–2592).

* cited by examiner

*Primary Examiner*—Anita Alanko
(74) *Attorney, Agent, or Firm*—Shirley L. Church; Kathi Bean; Joseph Bach

(57) ABSTRACT

We have discovered a method for plasma etching a carbon-containing silicon oxide film which provides excellent etch profile control, a rapid etch rate of the carbon-containing silicon oxide film, and high selectivity for etching the carbon-containing silicon oxide film preferentially to an overlying photoresist masking material. When the method of the invention is used, a higher carbon content in the carbon-containing silicon oxide film results in a faster etch rate, at least up to a carbon content of 20 atomic percent. In particular, the carbon-containing silicon oxide film is plasma etched using a plasma generated from a source gas comprising $NH_3$ and $C_xF_y$. It is necessary to achieve the proper balance between the relative amounts of $NH_3$ and $C_xF_y$ in the plasma source gas in order to provide a balance between etch by-product polymer deposition and removal on various surfaces of the substrate being etched. The $NH_3$ gas functions to "clean up" deposited polymer on the photoresist surface, on the etched surface, and on process chamber surfaces. The atomic ratio of carbon:nitrogen in the plasma source gas typically ranges from about 0.3:1 to about 3:1. We have found that $C_2F_6$ and $C_4F_8$ provide excellent etch rates during etching of carbon-containing silicon oxide films.

21 Claims, 2 Drawing Sheets

METHOD OF ETCHING CARBON-CONTAINING SILICON OXIDE FILMS

BACKGROUND OF THE INVENTION

1. Field of the Invention

The present invention pertains to etching of carbon-containing silicon oxide films.

2. Brief Description of the Background Art

Low k dielectric materials are the trend for the next generation of dielectric materials used in semiconductor manufacture. The term "low k dielectric" typically refers to any material having a dielectric constant (k) value lower than that of silicon dioxide (k≈4.0). There are many different kinds of low k dielectric materials, including organic polymer-based materials, as well as silicon oxide-based materials which contain additives such as fluorine, carbon, and hydrogen.

Various methods for producing carbon-containing silicon oxide films are known in the art. U.S. application Ser. No. 09/021,788, of Yau et al., and German Patent No. DE 19654737, of Itoh et al., for example, disclose methods for producing such films. In particular, the '788 application discloses a method for depositing a low dielectric constant film by reacting an organosilane compound (such as methyl silane, $CH_3SiH_3$) with an oxidizing gas (such as $N_2O$ or $O_2$). During deposition of the film, methyl ($CH_3$) groups bond to the silicon oxide structure. The presence of carbon in the film causes a reduction in the dielectric constant of the film.

Plasma etching of silicon oxide films is typically performed using a source gas containing a $C_xF_y$ gas, such as $CF_4$ or $C_2F_6$. The carbon and fluorine in the source gas are typically sufficient to provide an acceptable etch rate for the silicon oxide. However, for carbon-containing silicon oxide films, etching cannot proceed very far when $C_xF_y$ is used as the sole etchant gas. The carbon in the film, together with the carbon and fluorine in the plasma source gas, combine to produce undesirable long-chain carbon-fluorine polymers which deposit over surfaces of the semiconductor structure being etched, hampering the etching process. The long-chain carbon-fluorine polymers also contaminate surfaces within the process chamber.

Prior art solutions to this problem have included adding a source of oxygen to the $C_xF_y$ gas. The oxygen reacts with the carbon in the carbon-containing silicon oxide film, preventing undue polymer deposition and increasing the etch rate of the film. However, oxygen also attacks the overlying photoresist layer, which is typically used as a patterning mask for underlying feature (such as a contact via) etching. Therefore, although the presence of oxygen improves the etch rate of the carbon-containing silicon oxide film, the selectivity for etching the silicon oxide film in preference to an overlying photoresist layer reduced.

It would be desirable to provide an effective method for etching carbon-containing silicon oxide films that would provide both an acceptable etch rate and acceptable selectivity for etching the silicon oxide film relative to an overlying photoresist layer.

SUMMARY OF THE INVENTION

We have discovered a method for plasma etching a carbon-containing silicon oxide film which comprises exposing the film to a plasma generated from a source gas comprising $NH_3$ and $C_xF_y$. The carbon-containing silicon oxide film generally comprises less than about 20 atomic percent carbon; typically the carbon content ranges from about 8 to about 20 atomic percent carbon; more typically, the carbon content ranges from about 8 to about 13 atomic percent carbon. The carbon-containing silicon oxide film frequently contains hydrogen. When hydrogen is present, the hydrogen concentration is generally less than about 45 atomic percent of the overall film composition. Typically the hydrogen concentration ranges from about 30 to about 45 atomic percent; more typically, the hydrogen content ranges from about 30 to about 40 atomic percent of the carbon-containing silicon oxide film.

Active fluorine species in the etchant plasma react with silicon in the carbon-containing silicon oxide film (substrate). Oxygen species generated from the carbon-containing silicon oxide film and hydrogen species from the plasma react with carbon. The method of the invention provides excellent etch rates, as well as superior etch selectivity for the carbon-containing silicon oxide layer in preference to an overlying photoresist masking material. It is our opinion, but not by way of limitation, that etch selectivity is improved because a layer of polymer (generated from the $C_xF_y$ in the plasma source gas) is deposited upon the upper surface of the photoresist masking layer during the etching process. This layer of deposited polymer protects the photoresist from being consumed during the silicon oxide etching process. Simultaneously, the ammonia ($NH_3$) gas portion of the plasma source gas functions to "clean up" deposited polymer on the photoresist surface, on the etched surface, and on the process chamber surfaces. It is necessary to achieve the proper balance between the $C_xF_y$ and $NH_3$ in the plasma source gas in order provide a balance between by-product polymer deposition and removal on various surfaces of the substrate being etched. Oxygen may be added to the plasma source gas to increase the etch rate of the carbon-containing silicon oxide, but this reduces the selectivity in favor of etching of the carbon-containing silicon oxide relative to the photoresist.

Carbon and nitrogen are typically present in the source gas in an atomic ratio within a range of about 1:0.3 to about 1:3 of carbon:nitrogen; preferably, within a range of about 1:0.7 to about 1:2.2 of carbon:nitrogen; and more preferably, within a range of about 1:1 to about 1:1.8.

The method of the invention comprises exposing the carbon-containing silicon oxide film to a source gas comprising $NH_3$ and $C_xF_y$, where x ranges from about 1 to about 6 and y ranges from about 4 to about 8. Typically, x=2 to 4 and y=4 to 8. In particular, we have found that $C_2F_6$, $C_4F_6$, $C_4F_8$, and $C_5F_8$ provide excellent etch rates and etch select Although less preferred, the plasma source gas may further include a non-reactive, diluent gas selected from the group consisting of argon, helium, xenon, krypton, and combinations thereof.

The method of the invention for etching carbon-containing silicon oxide films has provided etch rates of at least 2.2 μm per minute and etch selectivity relative to an overlying photoresist layer of up to about 25:1. This combination of rapid etch rate of the carbon-containing silicon oxide with high etch selectivity relative to the photoresist masking layer was unexpected. Also important is the clean process chamber surface after completion of etch.

DETAILED DESCRIPTION OF THE PREFERRED EMBODIMENTS

Described in detail below is a method of etching a carbon-containing silicon oxide film. The method involves exposing the film to a plasma generated from a source gas comprising $NH_3$ and $C_xF_y$.

As a preface to the detailed description, it should be noted that, as used in this specification and the appended claims, the singular forms "a", "an", and "the" include plural referents, unless the context clearly dictates otherwise.

I. AN APPARATUS FOR PRACTICING THE INVENTION

Figure 1:
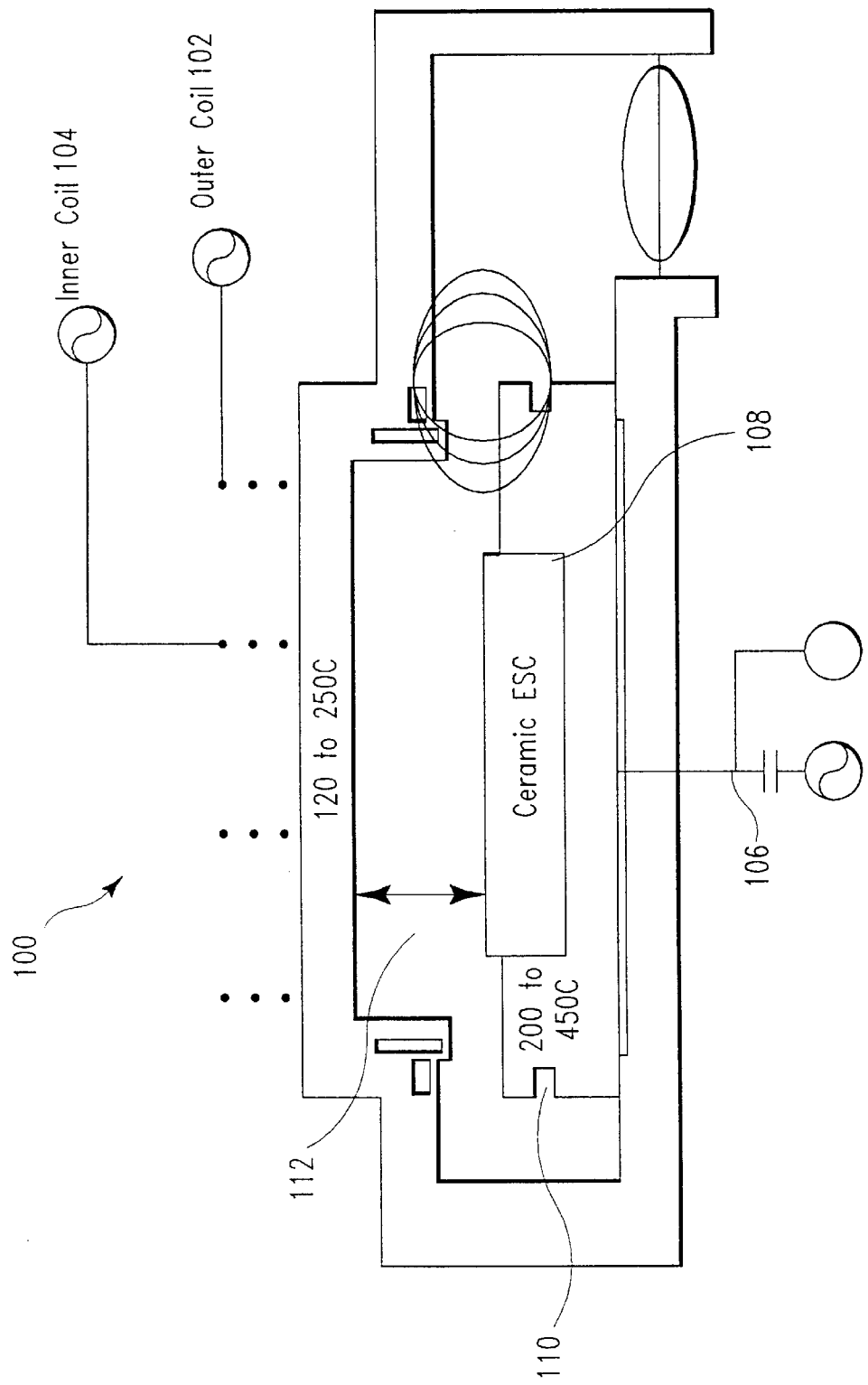
FIG. 1 shows an IPS™ etch process chamber 100 of the kind used during the generation of the data illustrated in FIG. 2.

FIG. 1 shows an example of an apparatus which can be used to practice the method of the invention, the Applied Materials IPS™ dielectric etch chamber (designated by reference numeral 100). The IPS™ chamber 100 includes two plasma power sources, provided by an outer coil 102 (frequency tuned at 2.0±0.1 MHZ) and an inner coil 104 (frequency tuned at 2.3±0.1 MHZ). A substrate (not shown, but typically a silicon wafer) is held to a support platform, which is typically a ceramic electrostatic chuck 108. A bias voltage may be applied to substrate support platform 108 by means of bias power source 106 (frequency tuned at 1.7±0.2 MHz). Plasma source gas is fed into the etch chamber from a location 110 which is beneath the substrate and moves toward the upper portion 112 of etch chamber 100, where a plasma is generated. The method of the invention is preferably performed in an apparatus having separate power controls for the plasma source power and substrate bias power.

Although the above apparatus provides excellent results, it is expected that the method can also be carried out in other apparatus of various kinds known in the art, including, but not limited to, RF generated parallel plate; electron cyclotron resonance (ECR); high-density reflected electron, helicon wave, inductively coupled plasma(ICP) and transformer coupled plasma (TCP) apparatus. Examples of such processing apparatus are described in U.S. Pat. Nos. 6,095,084; 6,077,384; 6,074,512; 6,071,372; 6,063,233; 6,054,013; 6,036,878; 6,026,762; 6,020,686; 5,976,308; and 5,900,064, each of which is hereby incorporated by reference.

II. THE METHOD OF THE INVENTION FOR ETCHING A CARBON-CONTAINING SILICON OXIDE FILM

The present invention pertains to etching of carbon-containing silicon oxide films. Typically, the films consist of methyl ($CH_3$) groups bonded to a silicon oxide structure. Carbon is generally present at less than about 30 atomic percent. Typically, the carbon content is within a range of about 8 to about 20 atomic percent; more typically, within the range of about 8 to about 13 atomic percent, of the silicon oxide film. The carbon content of the silicon oxide film is important because it affects both the general mechanical properties of the film and the conductivity of the film.

Hydrogen is also frequently present in the carbon-containing silicon oxide film. Generally, the hydrogen concentration is less than about 50 atomic percent. Typically, the hydrogen content is within a range of about 30 to about 45 atomic percent of the silicon oxide film.

The method of the invention comprises exposing the carbon-containing silicon oxide film to a plasma generated from a source gas comprising $NH_3$ and $C_xF_y$. Carbon and nitrogen are typically present in the plasma source gas in an atomic ratio within the range of about 0.3:1 to about 3:1 of carbon:nitrogen; preferably, within the range of about 0.5:1 to about 1.4:1 of carbon:nitrogen; most preferably, within the range of about 0.6:1 to about 1:1 of carbon:nitrogen. With reference to the $C_xF_y$ gas, x typically ranges from about 1 to about 6, and y typically ranges from about 4 to about 8. The $C_xF_y$ gas is typically selected from the group consisting of $C_2F_6$, $C_3F_6$, $C_4F_6$, $C_4F_8$, $C_5F_8$, and combinations thereof. In particular, we have found that $C_2F_6$ and $C_4F_8$ provide excellent etch rates and etch selectivity.

The plasma source gas may further include oxygen in order to increase the etch rate of the carbon-containing silicon oxide film. However, oxygen should comprise no more than about 30 volume % of the source gas, and typically less than about 20 volume %, as the presence of oxygen may compromise the selectivity for etching the carbon-containing silicon oxide film relative to an overlying photoresist layer.

Although less preferred, the plasma source gas may further include a non-reactive, diluent gas selected from the group consisting of argon, helium, xenon, krypton, and combinations thereof.

Typical process conditions for etching a carbon-containing silicon oxide film according to the method of the invention, when the power supply is controlled separately for the plasma source power and the substrate bias power, are presented in Table One, below. In cases where there is only a single plasma source power, the "Inner (W)" source power value is simply "0 W".

TABLE ONE

Preferred Embodiment Process Conditions for Etching Carbon-containing Silicon Oxide Films

| Process Parameter | Preferred Process Conditions | More Preferred Process Conditions | Most Preferred Process Conditions |
|---|---|---|---|
| $NH_3$ Flow Rate (sccm) | 50–150 | 75–125 | 75–100 |
| $C_xF_y$ Flow Rate (sccm) | 10–30 | 15–25 | 18–25 |
| $O_2$ Flow Rate (sccm) | 0–30 | 0–20 | 0–10 |
| Ar Flow Rate (sccm) | 0–1000 | 0–800 | 0–500 |
| Plasma Source Power* - Outer (W) | 800–2000 | 800–1600 | 1000–1600 |
| Plasma Source Power* - Inner (W) | 0–1000 | 0–600 | 0–500 |
| Substrate Bias Power** (W) | 600–1800 | 600–1500 | 800–1200 |
| Substrate Bias Voltage (-V) | 200–1000 | 200–800 | 400–700 |
| Process Chamber Pressure (mTorr) | 10–60 | 20–40 | 30–40 |
| Substrate Temperature (° C.) | −15–+15 | −15–+15 | −15–+15 |

*The term "source power" refers to the power that is responsible for sustaining the plasma by providing a major portion of the energy to create active etchant species in the process chamber.
**The term "bias power" refers to the power applied to the substrate support platen to produce a negative voltage on the substrate surface. Typically, the negative voltage is used to control high energy species bombardment and the directionality of ions toward a substrate.

During the development of the present method for etching carbon-containing silicon oxide films, we performed several experiments to optimize the plasma source gas composition and etch process conditions. The experiments were all performed in an Applied Materials IPS™ dielectric etch chamber, as shown in FIG. 1. The results of these developmental experiments are presented in Table Two, below. The use of an IPS™ dielectric etch chamber having both an outer plasma source power and an inner plasma source power provided unusually high uniformity of etch across the substrate (wafer) surface.

TABLE TWO

Carbon-Containing Silicon Oxide Film Etching Method, Developmental Data

| | Run # | | | | | | | |
|---|---|---|---|---|---|---|---|---|
| | 1 | 2 | 3 | 4 | 5 | 6 | 7 | 8 |
| $NH_3$ (sccm) | 100 | 100 | 100 | 70 | 70 | 70 | 70 | 70 |
| $C_4F_8$ (sccm) | 25 | 25 | 25 | 25 | 18 | 25 | 28 | 25 |
| Ar (sccm) | — | — | 100 | — | — | — | — | — |
| Proc. Chamber Pressure (mTorr) | 60 | 40 | 40 | 40 | 40 | 40 | 40 | 30 |
| Source Power (W)* | 1600 | 1600 | 1600 | 1200 | 1200 | 1200 | 1200 | 1200 |
| Bias Power (W) | 1200 | 1200 | 1200 | 1000 | 1000 | 850 | 1000 | 1000 |
| Substrate Temp. (° C.)** | 60 | 60 | 60 | 60 | 60 | 60 | 60 | 60 |
| $SiO_2$ Etch Rate (μm/min) | 3.1 | 2.4 | 2.2 | 2.6 | 2.8 | 2.5 | 2.6 | 2.2 |
| $SiO_2$:PR*** Etch Selectivity | 4.1:1 | 2.0:1 | 2.9:1 | 16:1 | 6.3:1 | 25:1 | 16:1 | 13:1 |
| Etch Profile | Tapered | Striation | Slight bowing | Vertical | Vertical | Vertical | Vertical | Bowing |

*This source power is a combination of the outer source power and the inner source power, where the ratio of the outer source power to the inner source power averaged about 2:1.
**This substrate temperature value is ± 20° C. Typically the temperature of the cathode upon which a wafer sets is about 10° C., and the wafer temperature is about 50° C. higher, depending on the particular process operating conditions.
***PR = Photoresist. The term "selectivity" is used to refer to the ratio of the etch rate of the $SiO_2$ to the etch rate of the photoresist.

Under the process conditions indicated above, where the chamber pressure was about 40 mTorr or less, the plasma density in the etch chamber during etching was estimated to range from about $5 \times 10^{11}$ $e^-/cm^3$ to about $5 \times 10^{12}$ $e^-/cm^3$.

Etch rates for the carbon-containing silicon oxide films ranged from 2.2 to 3.1 μm per minute. (In general, an etch rate of at least 0.8 μm per minute is considered acceptable.) Run #1 showed the highest etch rate, 3.1 μm per minute. The atomic ratio of carbon nitrogen in the plasma source gas in Run #1 was 1:1, with a relatively high process chamber pressure (60 mTorr), source power (1600 W), and bias power (1200 W).

Typically, a patterned photoresist layer is used as a mask to etch a feature in an underlying layer of carbon-containing silicon oxide. The term "feature" refers to, but is not limited to, interconnects, contacts, vias, trenches, and other structures which make up the topography of the substrate surface. A UV-5 photoresist manufactured by Shipley Co., Massachusetts, USA, was used in the development runs listed in Table Two. The photoresist layer had a thickness of about 8000 Å.

It is desirable that the photoresist masking layer be consumed at a much lower rate than the underlying layer which is being etched, that is, the etch selectivity for the carbon-containing silicon oxide relative to the photoresist should be high (typically, at least 5:1). Run #6 showed the highest silicon oxide photoresist etch selectivity, 25:1. Run #6 utilized an atomic ratio of 1.4:1 carbon:nitrogen in the plasma source gas, with a lower process chamber pressure (40 mTorr) and source power (1200 W). Run #6 also utilized the lowest bias power (850 W) out of all of the runs.

The best etch profile was also achieved in Run # 6. The term "etch profile" (or "feature profile") generally refers to, but is not limited to, the cross-sectional profile of an etched feature. In many instances herein, where the etched feature pattern is one of trenches etched within a substrate, the etch profile is described in terms of an angle between the trench sidewall and a horizontal line drawn along the bottom of the trench at the base of the trench. The term "vertical profile" refers to an etched trench profile where the trench sidewall is essentially perpendicular to the horizontal line drawn along the bottom of the trench. Frequently the angle between a line drawn along the trench sidewall and the horizontal line along the bottom of the trench is about 88° and 90° (or 90° to about 92°, depending on the direction from which the angle is measured). The term "undercut profile" refers to a trench sidewall profile where the width of the trench increases as the distance away from the opening at the top of the trench increases. The term "tapered profile" refers to a trench sidewall profile where the width of the trench decreases as the distance away from the opening at the top of the trench increases. A "bowed profile" is one in which the width of the trench is smaller at the top of the trench, enlarged as the trench goes deeper into the substrate, and then smaller again at the bottom of the trench.

The addition of argon to the plasma source gas in Run #3 resulted in a lowered etch rate (2.2 μm per minute), as well as a reduced silicon oxide:photoresist etch selectivity (2.9:1). Further, the etch profile obtained in Run #3 showed a slight bowing, that is, the width of the cross-section of the feature was largest approximately midway between the opening on the substrate surface and the bottom of the feature.

Overall, Run #6 provided the best results in terms of etch rate, etch profile, and selectivity for etching the silicon oxide layer relative to the overlying photoresist layer.

As demonstrated by the results presented in Table Two, above, the method of the invention provides excellent etch rates, as well as superior selectivity for etching a carbon-containing silicon oxide film relative to an overlying photoresist layer.

Figure 2:
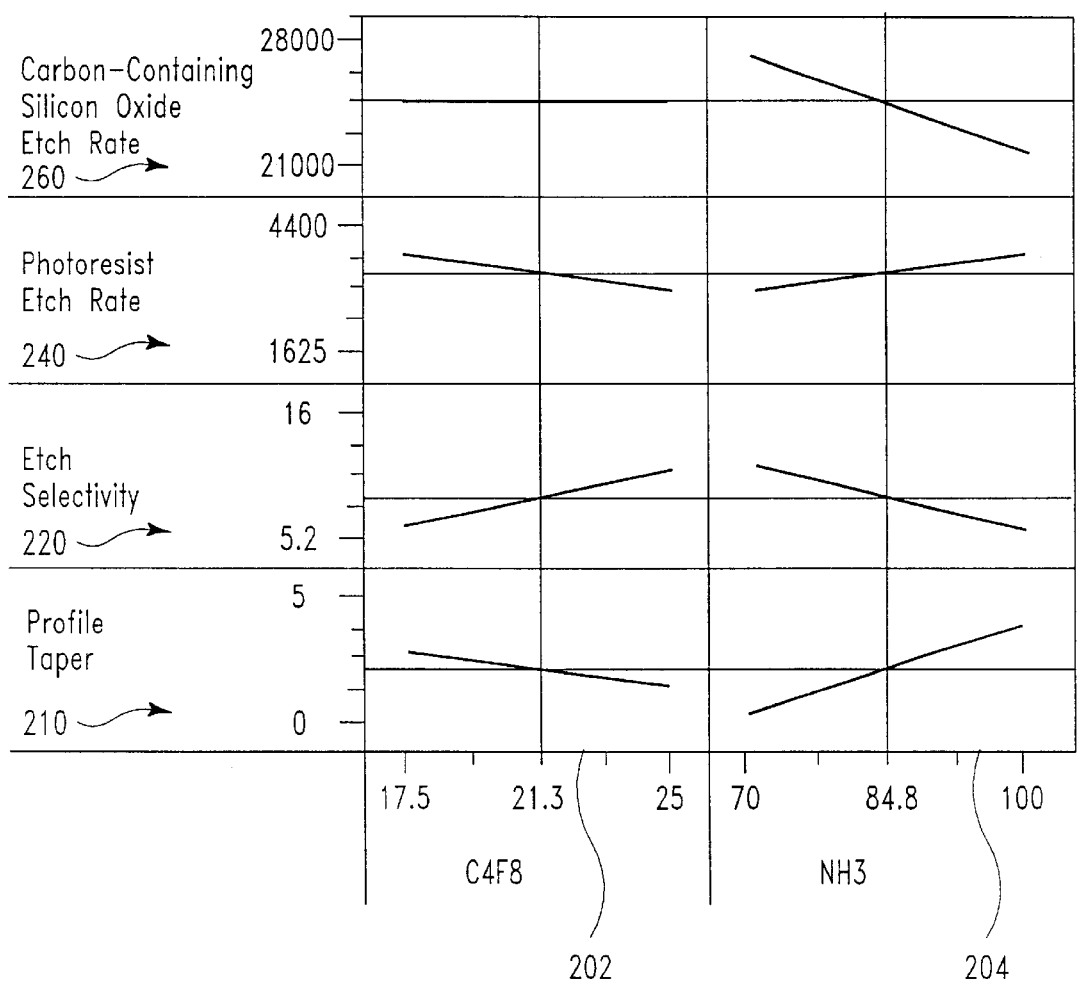
FIG. 2 shows the effect of changes in $C_4F_8$ and $NH_3$ gas feed rates to the plasma on the profile taper of an etched contact via; the etch selectivity, in terms of preference for etching carbon-containing silicon oxide relative to photoresist masking material; the etch rate of photoresist masking material; and the etch rate of carbon-containing silicon oxide.

FIG. 2 shows the effect of changing the relative amounts of $C_4F_8$ relative to $NH_3$ in a plasma source gas, when the other process variables were held constant as follows: The outer source power was 800 W at 2 MHZ ; the inner source power was 400 W at 2 MHZ; the bias power was 1000 W at 1.7 MHZ; the process chamber pressure was 40 mTorr; and the substrate temperature was within the range of 60–100° C., most commonly at about 60° C. Fifteen (15) Torr of helium back pressure was used against the backside of the substrate wafer to assist in heat transfer. The electrostatic chuck was water-cooled.

The scale labeled 202 in FIG. 2 shows the flow rate ranges for $C_4F_8$ in sccm, while the scale labeled 204 in FIG. 2 shows the flow rate ranges for $NH_3$.

The graphs 210 show the change in etched wall profile from vertical as a function of changes in the flow rates of $C_4F_8$ and $NH_3$. The profile is shown to change from about 0° to about 4°, where an increase in $C_4F_8$ causes a decrease in profile undercut, while an increase in $NH_3$ causes an increase in profile undercut.

The graphs 220 show the change in etch selectivity (etch rate ratio of carbon-containing silicon oxide:photoresist masking material) as a function of changes in the flow rates of $C_4F_8$ and $NH_3$. The selectivity is shown to change from about 5.2 to about 8.7, where an increase in $C_4F_8$ causes an increase in selectivity, while an increase in $NH_3$ causes a decrease in selectivity.

The graphs 240 show the change in photoresist masking material etch rate as a function of changes in the flow rates of $C_4F_8$ and $NH_3$. The etch rate is shown to vary from about 3300 Å per minute to about 4300 Å per minute, where an increase in $C_4F_8$ causes a decrease in photoresist etch rate, while an increase in $NH_3$ causes an increase in etch rate.

The graphs 260 show the change in carbon-containing silicon oxide layer etch rate as a function of changes in the flow rates of $C_4F_8$ and $NH_3$. The etch rate is shown to vary from about 22,500 Å per minute to about 27,500 Å per minute, where an increase in $C_4F_8$ causes no apparent change in the carbon-containing silicon oxide layer etch rate, while an increase in $NH_3$ causes a decrease in the etch rate. As shown in graph 260, changing the flow rate of either $C_4F_8$ or $N_3$ had minimal impact on the etch rate of the carbon-containing silicon oxide film.

In summary, the relative amounts of $C_xF_y$ and $NH_3$ need to be carefully balanced in order to maintain a vertical etch profile while providing high selectivity for etching carbon-containing silicon oxide relative to a photoresist masking material. Based on a series of experiments in which the carbon content of silicon oxide films was varied from 0 up to about 20%, we have also determined that films containing higher carbon concentrations have a higher etch rate when etched according to the method of the invention.

The above described preferred embodiments are not intended to limit the scope of the present invention, as one skilled in the art can, in view of the present disclosure expand such embodiments to correspond with the subject matter of the invention claimed below.

We claim:

1. A method of etching a carbon-containing silicon oxide film comprising:
   providing a semiconductor structure having a patterned photoresist layer overlying a surface of a carbon-containing silicon oxide film; and
   exposing said carbon-containing silicon oxide film to a plasma generated from a source gas comprising $NH_3$ and $C_xF_y$, where an atomic ratio of carbon:nitrogen in said source gas is less than about 3:1, whereby said carbon-containing silicon oxide film is selectively etched relative to said overlying photoresist layer at an etch rate ratio of said carbon-containing silicon oxide film to said overlying photoresist layer of at least 5:1.

2. The method of claim 1, wherein said carbon-containing silicon oxide film comprises less than about 30 atomic percent carbon.

3. The method of claim 1, wherein said carbon-containing silicon oxide film further comprises hydrogen, at a concentration of less than about 50 atomic percent hydrogen.

4. The method of claim 1, wherein an atomic ratio of carbon:nitrogen in said source gas ranges from about 0.5:1 to about 1.4:1.

5. The method of claim 4, wherein an atomic ratio of carbon:nitrogen in said source gas ranges from about 0.6:1 to about 1:1.

6. The method of claim 1, wherein x ranges from about 1 to about 6, and y ranges from about 4 to about 8.

7. The method of claim 6, wherein x=2–5 and y=6–8.

8. The method of claim 7, wherein said $C_xF_y$ gas is selected from the group consisting of $C_2F_6$, $C_3F_6$, $C_4F_6$, $C_4F_8$, $C_5F_8$, and combinations thereof.

9. The method of claim 8, wherein said $C_xF_y$ gas is selected from the group consisting of $C_2F_6$ and $C_4F_8$.

10. The method of claim 1, wherein said source gas further comprises $O_2$, at a concentration of less than about 30 volume %.

11. The method of claim 1, wherein said source gas further comprises a non-reactive, diluent gas selected from the group consisting of argon, helium, xenon, krypton, and combinations thereof.

12. The method of claim 1, wherein said carbon-containing silicon oxide film is etched at a rate of at least 1.5 μm per minute.

13. The method of claim 1, wherein said etch rate ratio of said carbon-containing silicon oxide film to said overlying photoresist layer is at least 10:1.

14. The method of claim 1, wherein a substrate bias voltage within the range of about –200 V to about –1000 V is applied during the performance of said method.

15. The method of claim 1, wherein a plasma density within a substrate processing area during performance of said method is within a range from about $5\times10^{11}$ e$^-$/cm$^3$ to about $5\times10^{12}$ e$^-$/cm$^3$.

16. The method of claim 1, wherein a source power applied during performance of said method ranges from about 800 W to about 2000 W.

17. A method of etching a carbon-containing silicon oxide film comprising:
   providing a semiconductor structure having a patterned photoresist layer overlying a surface of a carbon-containing silicon oxide film;
   exposing said carbon-containing silicon oxide film to a plasma generated from a source gas comprising $NH_3$ and $C_xF_y$, where an atomic ratio of carbon:nitrogen in said source gas is less than about 3:1; and
   applying a substrate bias within a range of about –200 V to about –1000 V to said semiconductor structure, and a plasma source power using one device which is external and one device which is internal to a process chamber in which said etching is carried out, where by said carbon-containing silicon oxide film is selectively etched relative to said overlying photoresist layer at an etch rate ratio of said carbon-containing silicon oxide film to said overlying photoresist layer of at least 5:1.

18. The method of claim 18, wherein a sum of said plasma source power applied to said external and said internal devices is within a range from about 800 W to about 3,000 W.

19. The method of claim 1, wherein the ratio of plasma source power applied using said device which is external to plasma source power applied using said device which is internal is 2:1 or higher.

20. The method of claim 1, or claim 2 or claim 3 or claim 17, wherein said carbon-containing silicon oxide film comprises methyl groups bonded to a silicon oxide structure.

21. The method of claim 20, wherein said carbon-containing silicon oxide film exhibits a carbon content ranging from about 8 atomic percent to about 20 atomic percent carbon.

* * * * *